US009778647B2

(12) United States Patent
Teshima et al.

(10) Patent No.: US 9,778,647 B2
(45) Date of Patent: Oct. 3, 2017

(54) WORKING MACHINE AND POSITIONAL DEVIATION DATA ACQUISITION METHOD

(71) Applicant: FUJI MACHINE MFG. CO., LTD., Chiryu (JP)

(72) Inventors: Yasuhiro Teshima, Toyota (JP); Takashi Taneike, Okazaki (JP); Takashi Nakane, Okazaki (JP); Masaki Kato, Toyota (JP)

(73) Assignee: FUJI MACHINE MFG. CO., LTD., Chiryu (JP)

( * ) Notice: Subject to any disclaimer, the term of this patent is extended or adjusted under 35 U.S.C. 154(b) by 295 days.

(21) Appl. No.: 14/655,479

(22) PCT Filed: Dec. 28, 2012

(86) PCT No.: PCT/JP2012/084119
§ 371 (c)(1),
(2) Date: Jun. 25, 2015

(87) PCT Pub. No.: WO2014/103027
PCT Pub. Date: Jul. 3, 2014

(65) Prior Publication Data
US 2015/0355626 A1      Dec. 10, 2015

(51) Int. Cl.
*G05B 19/402*       (2006.01)
*B25J 9/16*         (2006.01)
(Continued)

(52) U.S. Cl.
CPC ......... *G05B 19/402* (2013.01); *B25J 9/1687* (2013.01); *H05K 13/0413* (2013.01); *H05K 13/08* (2013.01); *G05B 2219/35491* (2013.01)

(58) Field of Classification Search
CPC ......... G05B 19/402; G05B 2219/35491; B25J 9/1687; H05K 13/0413; H05K 13/08
(Continued)

(56) References Cited

U.S. PATENT DOCUMENTS

| 5,452,509 A | 9/1995 | Suzuki et al. |
| 2001/0047586 A1* | 12/2001 | Kawai ............... H05K 13/0413 29/833 |
| 2013/0047392 A1 | 2/2013 | Iwaki et al. |

FOREIGN PATENT DOCUMENTS

| JP | 05 198988 | 8/1993 |
| JP | 2001 320195 | 11/2001 |

(Continued)

OTHER PUBLICATIONS

International Search Report Issued Jan. 29, 2013 in PCT/JP2012/084119 filed Dec. 28, 2012.

*Primary Examiner* — Sean Shechtman
*Assistant Examiner* — Shon Foley
(74) *Attorney, Agent, or Firm* — Oblon, McClelland, Maier & Neustadt, L.L.P.

(57) ABSTRACT

In a work machine which includes a working head including a lifting and lowering unit including a working device and a first lifting and lowering device which lifts and lowers the working device, and a second lifting and lowering device which lifts and lowers the lifting and lowering unit, a positional deviation ($\Delta x$, $\Delta y$) of the working device in a direction which is perpendicular to a lifting and lowering direction is eliminated. Since the positional deviation is caused by both an inclination of a lifting and lowering axis line $L_1$ of the working device by the first lifting and lowering device and an inclination of a lifting and lowering axis line $L_2$ of the lifting and lowering unit by the second lifting and lowering device, based on positional deviation data a target moving position is corrected.

7 Claims, 6 Drawing Sheets

(51) Int. Cl.
*H05K 13/04* (2006.01)
*H05K 13/08* (2006.01)

(58) Field of Classification Search
USPC .................................................. 700/114, 121
See application file for complete search history.

(56) References Cited

FOREIGN PATENT DOCUMENTS

| | | |
|---|---|---|
| JP | 2009 164276 | 7/2009 |
| JP | 2011 253869 | 12/2011 |
| JP | 2012 101879 | 5/2012 |
| WO | WO 2012140975 A1 * 10/2012 | ......... H05K 13/0452 |

* cited by examiner

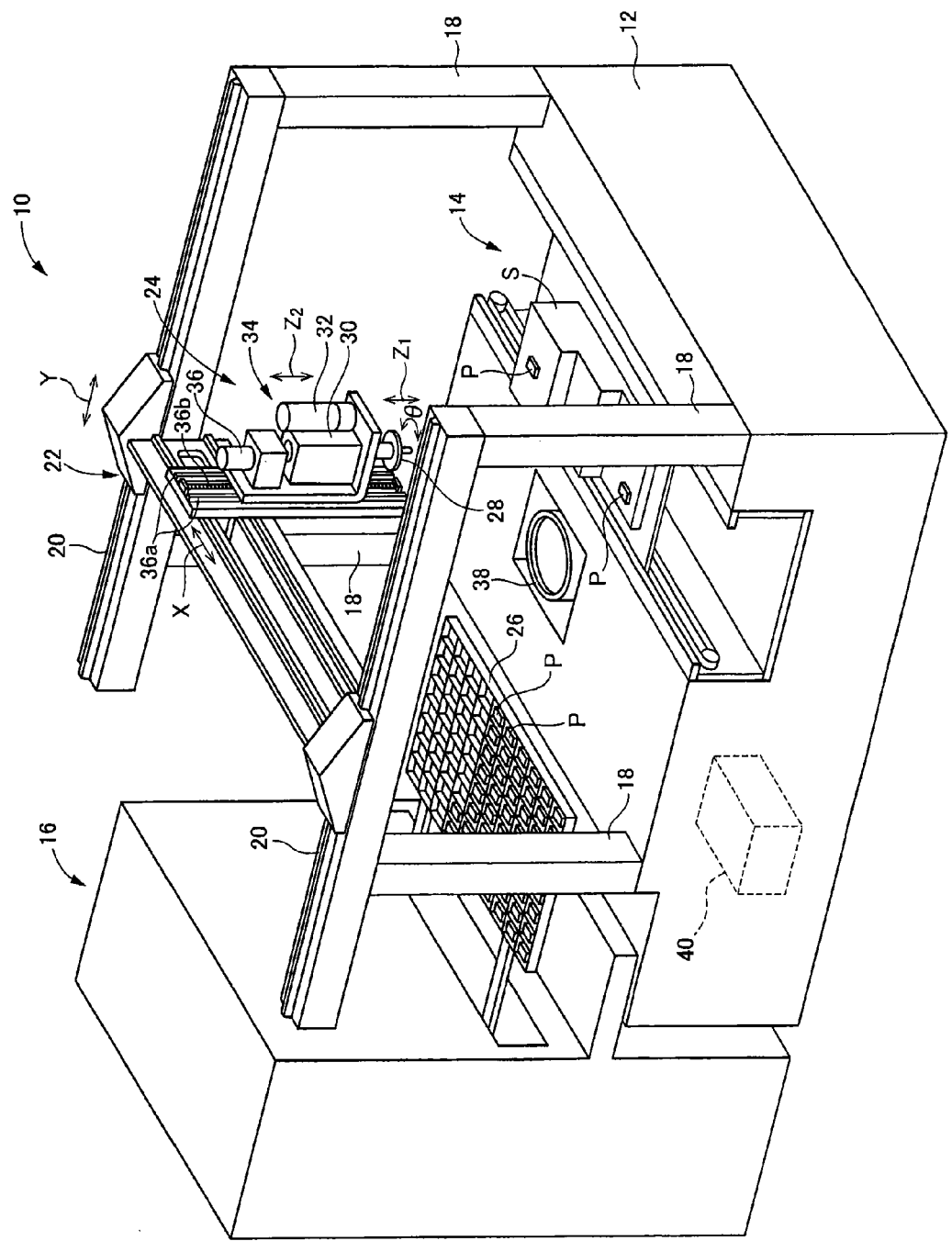
[FIG. 1]

[FIG. 2]
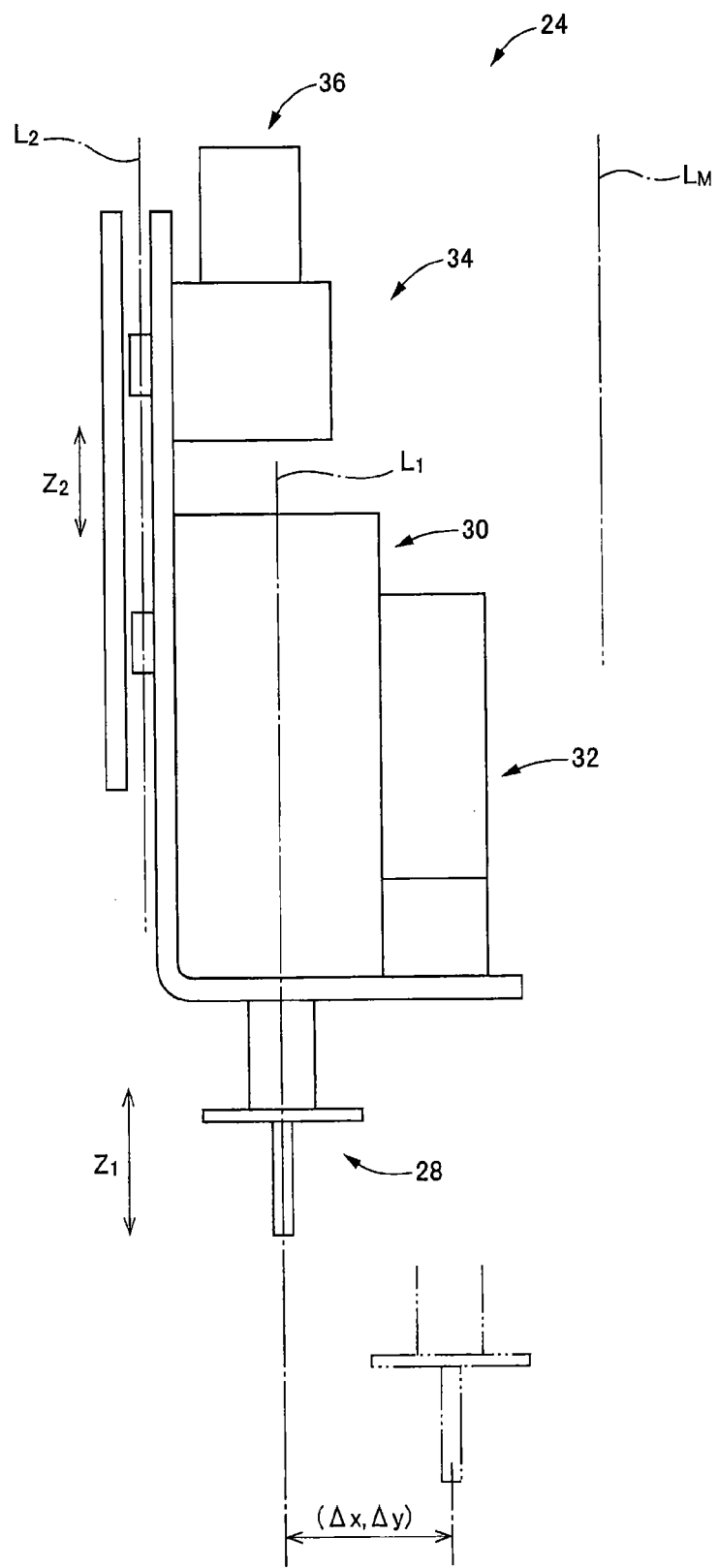

FIG. 3A

| Δx | | UNIT RAISED AND LOWERED POSITION  $z_2$ | | | | | | |
|---|---|---|---|---|---|---|---|---|
| | | &.& | &.& | &.& | &.& | &.& | &.& | &.& |
| NOZZLE RAISED AND LOWERED POSITION  $z_1$ | #.# | | | *.*** | *.*** | *.*** | *.*** | *.*** |
| | #.# | | *.*** | *.*** | *.*** | *.*** | *.*** | |
| | #.# | *.*** | *.*** | 0.000 | *.*** | *.*** | | |
| | #.# | *.*** | *.*** | *.*** | *.*** | | | |
| | #.# | *.*** | *.*** | *.*** | | | | |

FIG. 3B

| Δy | | UNIT RAISED AND LOWERED POSITION  $z_2$ | | | | | | |
|---|---|---|---|---|---|---|---|---|
| | | &.& | &.& | &.& | &.& | &.& | &.& | &.& |
| NOZZLE RAISED AND LOWERED POSITION  $z_1$ | #.# | | | *.*** | *.*** | *.*** | *.*** | *.*** |
| | #.# | | *.*** | *.*** | *.*** | *.*** | *.*** | |
| | #.# | *.*** | *.*** | 0.000 | *.*** | *.*** | | |
| | #.# | *.*** | *.*** | *.*** | *.*** | | | |
| | #.# | *.*** | *.*** | *.*** | | | | |

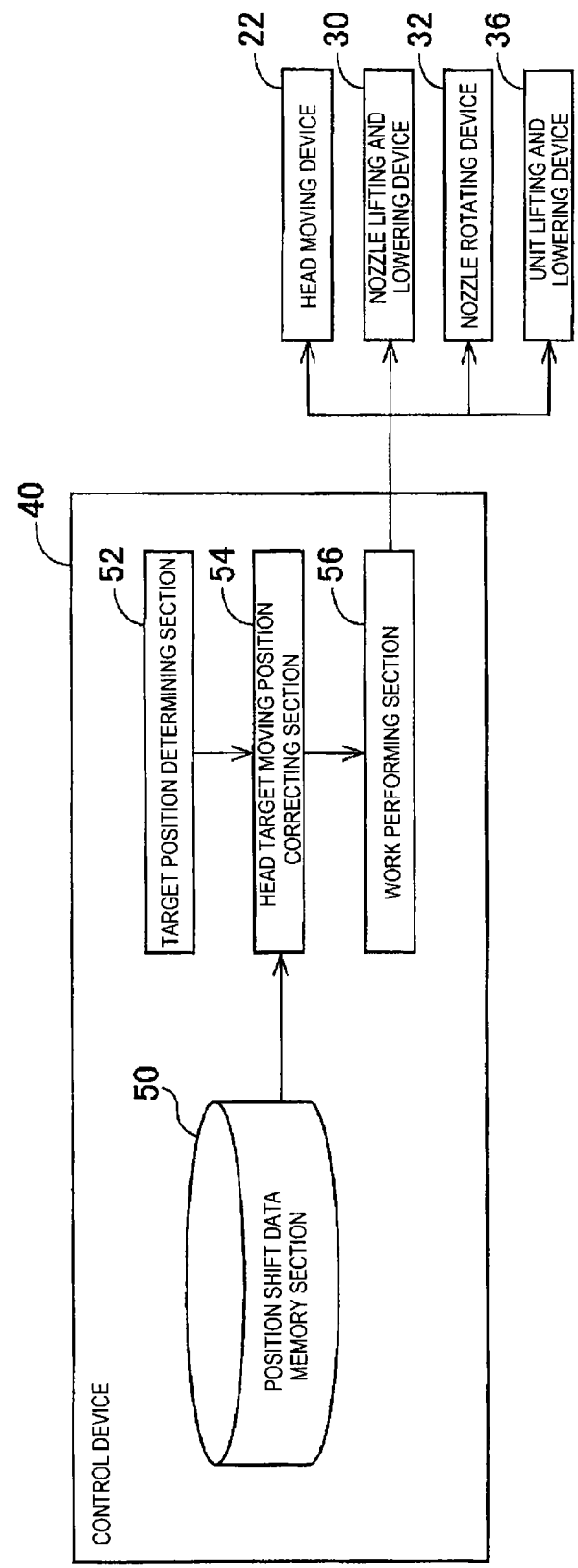
[FIG. 4]

[FIG. 6]
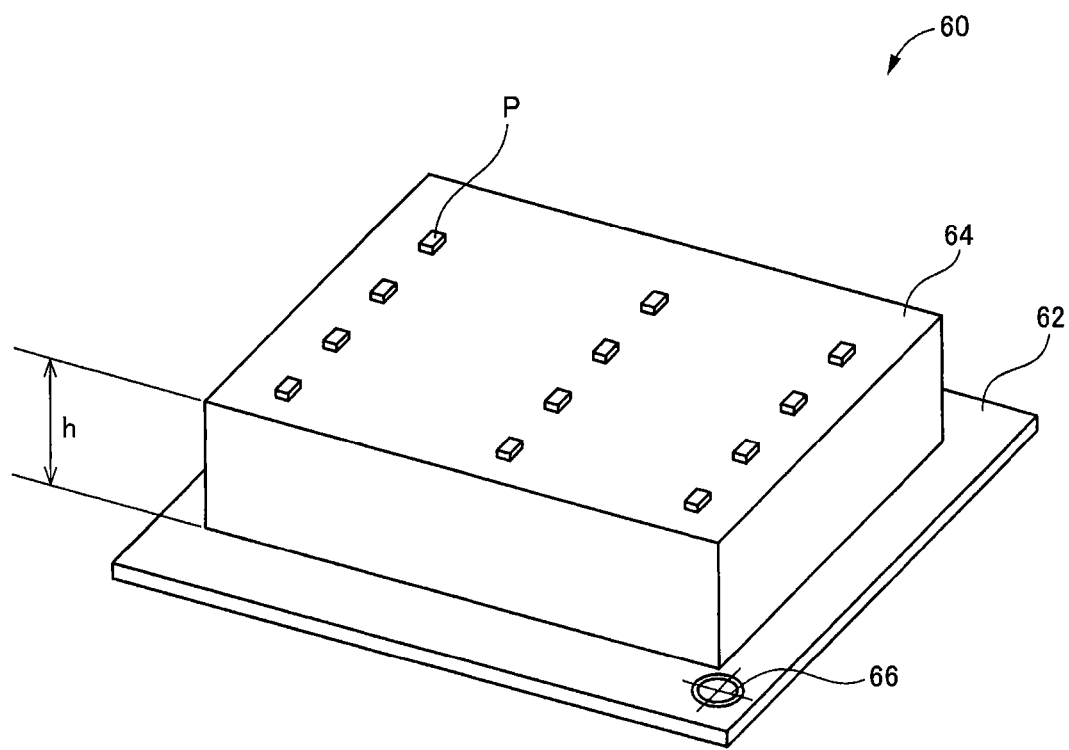

WORKING MACHINE AND POSITIONAL DEVIATION DATA ACQUISITION METHOD

TECHNICAL FIELD

The present invention relates to a work machine which includes a working device and performs work by the working device, and to a method for obtaining positional deviation data of the working device.

BACKGROUND ART

Among work machines which move a working head which includes a working device and a device that lifts and lowers the working device, and perform work, for example, there is a work machine which has a function of lifting and lowering the working device in two stages as described in the following patent literature. In such a work machine, for example, a working head includes: (a) a lifting and lowering unit which includes a working device and a first lifting and lowering device that lifts and lowers the working device; and (b) a second lifting and lowering device which lifts and lowers the lifting and lowering unit. In addition, since the work machine has a wide range of lifting and lowering of the working device, it is possible to perform work at locations which are relatively largely different in height from each other by one working device, and to make a convenient work machine.

CITATION LIST

Patent Literature

PTL 1: JP-A-2011-253869

SUMMARY OF INVENTION

Technical Problem

In the working head which has the above-described configuration, the working device is lifted and lowered along a first lifting and lowering axis line which extends in a vertical direction by the first lifting and lowering device, and the lifting and lowering unit is lifted and lowered along a second lifting and lowering axis line which extends in the vertical direction by the second lifting and lowering device. However, extending directions of the first lifting and lowering axis line and the second lifting and lowering axis line are not always accurate, and in addition, there is a possibility that there is a difference in extending directions from each other, and thus, a positional deviation in accordance with a lifted and lowered position of the working device, that is, a positional deviation in a perpendicular direction which is perpendicular to the vertical direction, is generated. In order to eliminate the positional deviation, the movement of the working head in the perpendicular direction by a head moving device is controlled in consideration of the positional deviation. However, since there are the above-described two lifting and lowering axis lines, it is not possible to accurately eliminate the positional deviation simply based on the lifted and lowered position of the working device. In consideration of such a circumstance, the present invention is to provide a work machine which can accurately eliminate a positional deviation of a working device regardless of a configuration in which the working device is lifted and lowered in two stages, and to provide a method for obtaining positional deviation data which is used in accurately eliminating the positional deviation.

Solution to Problem

A work machine of the present invention is a work machine having the above-described configuration, and a control device which has a function of controlling the working device is configured to correct a target moving position when the working head moves in the perpendicular direction by the head moving device, based on positional deviation data in which the positional deviation of the working device in the perpendicular direction at least due to an inclination of the first lifting and lowering axis line and an inclination of the second lifting and lowering axis line is associated with both a lifted and lowered position of the working device and a lifted and lowered position of the lifting and lowering unit. In addition, a positional deviation data obtaining method of the present invention for obtaining the positional deviation data includes: (A) a step of operating the working device by changing both the lifted and lowered position of the working device and the lifted and lowered position of the lifting and lowering unit between a plurality of set positions; and (B) a step of obtaining the positional deviation of the working device in the perpendicular direction which is associated with both each of the plurality of lifted and lowered positions of the working device and each of the plurality of lifted and lowered positions of the lifting and lowering unit, based on a result of the step of operating the working device.

Advantageous Effects of Invention

According to the work machine of the present invention, since the movement of the working head in the perpendicular direction is controlled, based on the positional deviation data inconsideration of both the inclination of the first lifting and lowering axis line and the inclination of the first lifting and lowering axis line, it is possible to accurately eliminate the positional deviation of the working device in the perpendicular direction. In addition, according to the positional deviation data obtaining method of the present invention, it is possible to easily obtain the positional deviation data.

BRIEF DESCRIPTION OF DRAWINGS

FIG. 1 is a perspective view illustrating a configuration of hardware of a work machine of Example.

FIG. 2 is a view illustrating a positional deviation of a working device.

FIG. 3(a) and FIG. 3(b) are tables illustrating an example of positional deviation data.

FIG. 4 is a block diagram illustrating a functional configuration of a control device which includes the work machine.

FIG. 6 is a perspective view illustrating a jig which is used when obtaining the positional deviation data by component assembly work.

DESCRIPTION OF EMBODIMENTS

Figure 5A:
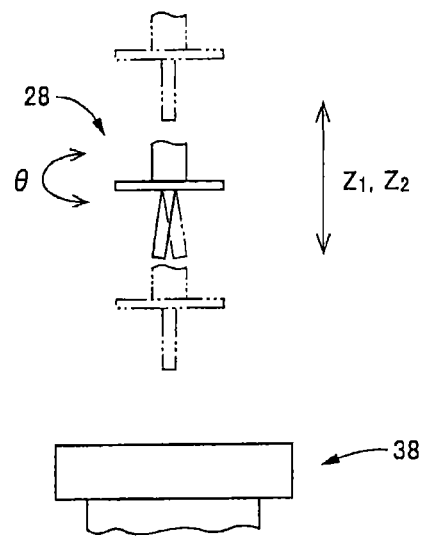
FIG. 5 (a) is a view illustrating obtaining of the positional deviation data by using an imaging device.
FIG 5(b) illustrates an image obtained by the imaging device.

Hereinafter, an embodiment of the present invention will be described in detail with reference to the drawings as Example. In addition, the present invention can realize various aspects which are changed and improved in various manners based on knowledge of those skilled in the art in addition to the following Example.

EXAMPLE

[A] Configuration of Hardware of Work machine

As illustrated in FIG. 1, a work machine of Example is a component assembly machine 10 which assembles a component P to a base material S, and the component assembly machine 10 includes a base 12, a base material conveyer device 14 which is attached to the base 12, a tray-type component supply device 16, an XY robot-type head moving device 22 which is supported by one pair of fixing beams 20 that are constructed by props 18, and a working head 24 which is moved by the head moving device 22 in a working space above the base 12.

The base material conveyer device 14 has a function of conveying in and out the base material S and holding the base material S at a set position. The component supply device 16 houses a plurality of trays 26, and supplies the component P which is placed on one of the trays 26 by pushing out one of the trays 26 to the set position. The head moving device 22 is a device in which a device that moves the working head 24 in an X direction illustrated in the drawing and a device that moves the working head 24 in an Y direction are combined with each other, and is a device which moves the working head 24 in a direction (hereinafter, there is a case where this direction is referred to as a "perpendicular direction") which is perpendicular to a vertical direction along one plane which is parallel to the X direction and the Y direction. Meanwhile, the perpendicular direction can be considered as a direction which is defined by an X direction component and a Y direction component.

The working head 24 includes: (a) a lifting and lowering unit 34 which includes a suction nozzle 28 which is a component holding device (one type of a "working device"), a nozzle lifting and lowering device 30 which functions as a first lifting and lowering device that lifts and lowers the suction nozzle 28 in the vertical direction (Z direction), and a nozzle rotating device 32 which functions as a device rotating device that rotates the suction nozzle 28 around a axis line that extends in the vertical direction; and (b) a unit lifting and lowering device 36 which functions as a second lifting and lowering device that lifts and lowers the lifting and lowering unit 34 in the vertical direction (Z direction). Meanwhile, in the drawing, a direction of lifting and lowering the suction nozzle 28 by the nozzle lifting and lowering device 30 is expressed as $Z_1$, a direction of lifting and lowering the lifting and lowering unit 34 by the unit lifting and lowering device 36 is expressed as $Z_2$, and a direction of rotating the suction nozzle 28 by the nozzle rotating device 32 is expressed as θ. Although not illustrated in the drawing, the nozzle lifting and lowering device 30 includes a shaft body in which the suction nozzle 28 is attached to a lower end section thereof, a guide mechanism which includes a guide that guides movement of the shaft body in the vertical direction, and a lifting and lowering mechanism which lifts and lowers the shaft body along the guide by using a ball screw mechanism. Similarly, the unit lifting and lowering device 36 includes a guide mechanism which includes a guide that guides the movement of the lifting and lowering unit 34 in the vertical direction, and a lifting and lowering mechanism which lifts and lowers the lifting and lowering unit 34 along the guide by using a ball screw mechanism. In the drawing, a guide 36a and a screw rod 36b which respectively constitute the guide mechanism of the unit lifting and lowering device 36 and the ball screw mechanism of the lifting and lowering mechanism, are illustrated. In addition, in the lifting and lowering mechanism of the unit lifting and lowering device 36, the screw rod 36b is fixed, and the lifting and lowering unit 34 is lifted and lowered as a nut (not illustrated) which is screwed to the screw rod 36b rotates.

The component P which is supplied by the component supply device 16 is held to be sucked by the suction nozzle 28 which is included in the working head 24, and as the working head 24 is moved by the head moving device 22, the component P is carried to above the base material S which is held by the base material conveyer device 14. At this position, the component P which is carried to a predetermined position is lowered to a predetermined height by the unit lifting and lowering device 36 and the nozzle lifting and lowering device 30, and is assembled to an assembly surface which is an upper surface of the base material S.

A camera 38 which functions as an imaging device that images an upper part is attached to the base 12 between the base material conveyer device 14 and the component supply device 16, and the camera 38 images the component P which is held by the suction nozzle 28 from below, and a position and a posture of holding the component P by the suction nozzle 28 are grasped by imaging data which is obtained by imaging. Based on the grasped holding position and holding posture, adjustment of an assembly position by the head moving device 22 and adjustment of an assembly posture (rotating position, orientation) by the nozzle rotating device 32 are performed, and the component P is assembled with an accurate attaching posture at an accurate attaching position of the base material S. During assembly work (component assembly work) to the base material S of the component P which is performed in this manner, operations of the head moving device 22, the nozzle lifting and lowering device 30, the nozzle rotating device 32, the unit lifting and lowering device 36, or the like, are controlled by a control device 40 which is installed inside the base 12 that includes a computer as a main constituent element.

[B] Relationship between Lifting and lowering of Working Device and Positional deviation in Perpendicular Direction, and Positional deviation Data The component assembly machine 10 can assemble the component P onto the assembly surfaces, which have relatively different heights from each other, of the base material S, or can assemble the component onto the upper surfaces of a plurality of the base materials S which have different heights from each other. For this reason, a lifting and lowering range of the suction nozzle 28 which is the working device is comparatively wide. In order to make the lifting and lowering range wide, in the component assembly machine 10, the suction nozzle 28 is lifted and lowered in two stages by both the nozzle lifting and lowering device 30 which is the first lifting and lowering device and the unit lifting and lowering device 36 which is the second lifting and lowering device, as described above. When describing with reference to FIG. 2, the component assembly machine 10 is configured such that the suction nozzle 28 is lifted and lowered by the nozzle lifting and lowering device 30 along a first lifting and lowering axis line $L_1$ which extends in the vertical direction, and the lifting and lowering unit 34 is lifted and lowered by the unit lifting and lowering device 36 along a second lifting and lowering axis line $L_2$ which extends in the vertical direction.

Both the first lifting and lowering axis line $L_1$ and the second lifting and lowering axis line $L_2$ can be parallel to a reference axis line ( )$L_M$ of the component assembly machine 10. However, in relation to the manufacturing accuracy of the component assembly machine 10, the first lifting and lowering axis line $L_1$ and the second lifting and lowering axis line $L_2$ are allowed to be slightly inclined with respect to the reference axis line $L_M$. Specifically, in other words, for example, by an inclination of the guide of the guide mechanism which constitutes each of the nozzle lifting and lowering device 30 and the unit lifting and lowering device 36 or an inclination of the nozzle lifting and lowering device 30 and the unit lifting and lowering device 36 themselves, the first lifting and lowering axis line $L_1$ and the second lifting and lowering axis line $L_2$ are allowed to be inclined to some extent. Therefore, since the positional deviation in the perpendicular direction is generated by the position of the suction nozzle 28 in the vertical direction, in the component assembly work, it is desirable that the positional deviation is eliminated. Meanwhile, in the drawing, the inclinations of the first lifting and lowering axis line $L_1$ and the second lifting and lowering axis line $L_2$ are considered in a two-dimensional manner, but the inclination is a concept which includes an orientation and an inclination amount of the inclination in the X direction and in the Y direction. Therefore, since the above-described positional deviation also includes a direction of the positional deviation in the X direction and in the Y direction and a positional deviation amount, the positional deviation is expressed as a positional deviation $(\Delta x, \Delta y)$ by using the X direction component and the Y direction component of the positional deviation amount.

However, since the suction nozzle 28 is lifted and lowered in two stages as described above, the positional deviation $(\Delta x, \Delta y)$ does not have a linear relationship with a position (absolute position of a nozzle) $z_A$ of the suction nozzle 28 from a reference of the component assembly machine in the Z direction. Specifically, since the first lifting and lowering axis line $L_1$ and the second lifting and lowering axis line $L_2$ are not limited to a parallel relationship, for example, even when the absolute positions of a nozzle $z_A$ are the same as each other, the positional deviation $(\Delta x, \Delta y)$ may vary depending on the combination of a nozzle lifted and lowered position $z_1$ which is a lifted and lowered position of the suction nozzle 28 by the nozzle lifting and lowering device 30 and a unit lifted and lowered position $z_2$ which is a lifted and lowered position of the lifting and lowering unit 34 by the unit lifting and lowering device 36. In other words, the positional deviation $(\Delta x, \Delta y)$ depends on both the nozzle lifted and lowered position $z_1$ and the unit lifted and lowered position $z_2$. In other words, the positional deviation is in accordance with a combination of the nozzle lifted and lowered position $z_1$ and the unit lifted and lowered position $z_2$.

Here, in the component assembly machine 10, in advance, positional deviation data in which the positional deviation $(\Delta x, \Delta y)$ is associated with both the nozzle lifted and lowered position $z_1$ and the unit lifted and lowered position $z_2$ is prepared, and in the component assembly work, processing for eliminating the positional deviation $(\Delta x, \Delta y)$ is performed. The positional deviation data is data which is illustrated in FIG. 3, and specifically, is configured of a positional deviation table in the X direction in FIG. 3(a) which corresponds to the X direction component, and a positional deviation table in the Y direction in FIG. 3(b) which corresponds to the Y direction component.

In any of the above-described two tables, in rows, a plurality of nozzle lifted and lowered positions $z_1$ in accordance with the lifting and lowering range of the suction nozzle 28 are discretely set (values are conveniently expressed as "#.#" for convenience, and in columns, a plurality of unit lifted and lowered positions $z_2$ in accordance with the lifting and lowering range of the lifting and lowering unit 34 are discretely set (values are expressed as "&. &" for convenience). Values (values are expressed as "*.***" for convenience) which are written in a cell that is included in a row that corresponds to a specific nozzle lifted and lowered position $z_1$, and is included in a column that corresponds to a specific unit lifted and lowered position $z_2$, are components $\Delta x$ and $\Delta y$ of the positional deviation of the suction nozzle 28 which is generated at the specific unit lifted and lowered position $z_2$ and at the specific unit lifted and lowered position $z_2$. Meanwhile, the nozzle lifted and lowered position $z_1$ and the unit lifted and lowered position $z_2$ at which the components $\Delta x$ and $\Delta y$ of the positional deviation become "0.000", are a standard nozzle lifted and lowered position $z_{10}$ and a standard unit lifted and lowered position $z_{20}$ at which the positional deviation in the perpendicular direction is not generated.

In addition, due to a structure of the head moving device 22, it is also predicted that the inclination of the first lifting and lowering axis line $L_1$ with respect to the reference axis line $L_M$ and the inclination of the second lifting and lowering axis line $L_2$ with respect to the reference axis line $L_M$ vary by a position to which the working head 24 is moved by the head moving device 22, that is, a head moving position (x, y) which is a position to which the working head 24 is moved in the perpendicular direction. In this case, for example, the positional deviation data with respect to each of the head moving positions (x, y) that are discretely set in accordance with a moving range of the working head 24 may be prepared. In other words, in this case, the positional deviation $(\Delta x, \Delta y)$ is also associated with the head moving position (x, y).

[C] Control by Control Device and Functional Configuration of Control Device

In relation to control in the component assembly work, it can be considered that the control device 40 has a functional configuration as illustrated in FIG. 4. As illustrated in the drawing, the control device 40 has a positional deviation data memory section 50 which stores the positional deviation data. In addition, in the component assembly work, in accordance with the assembly position and the height of the assembly surface of the component P, a target position determining section 52 which determines each of a target head target moving position (x*, y*) which is a target of the head moving position (x, y), a nozzle target lifted and lowered position $z_1$* which functions as a first target lifted and lowered position that is a target of the nozzle lifted and lowered position $z_1$, and a unit target lifted and lowered position $z_2$* which functions as a second target lifted and lowered position that is a target of the unit lifted and lowered position $z_2$, is provided.

Based on the determined nozzle target lifted and lowered position $z_1$* and the unit target lifted and lowered position $z_2$*, a head target moving position correcting section 54 corrects the determined head target moving position (x*, y*) with reference to the stored positional deviation data. Specifically, in the positional deviation data, the components $\Delta x$ and $\Delta y$ of the positional deviation which are included in a cell that corresponds to the nozzle target lifted and lowered position $z_1$* and the unit target lifted and lowered position $z_2$* are approved, and based on the approved $\Delta x$ and $\Delta y$, a head target moving position $(x_C^*, y_C^*)$ after the correction is determined in accordance with the following formula.

$$x_C^* = x^* - *.***, \quad y_C^* = y^* - *.***$$

Meanwhile, in the positional deviation data, the nozzle lifted and lowered position $z_1$ and the unit lifted and lowered position $z_2$ are discretely set, and when the nozzle target lifted and lowered position $z_1$* and the unit target lifted and lowered position $z_2$* are not the set nozzle lifted and lowered position $z_1$ and the unit lifted and lowered position $z_2$, interpolation processing is performed based on a plurality of values *.*** of positional deviation in accordance with the close nozzle lifted and lowered position $z_1$ and the unit lifted and lowered position $z_2$, and approximately, the components Δx and Δy of the positional deviation are approved. Since the interpolation processing follows a known pure mathematical technique, here, the description thereof will be omitted.

In addition, when the plurality of positional deviation data are also provided in association with the head moving position (x, y), the positional deviation data which corresponds to the head target moving position (x*, y*) is selected, based on the selected positional deviation data, the components Δx and Δy of the positional deviation may be approved.

In addition, as a work performing section 56 controls the nozzle lifting and lowering device 30, the unit lifting and lowering device 36, the head moving device 22, or the like, based on the head target moving position ($x_C$*, $y_C$*) which is corrected in the above-described manner, the determined nozzle target lifted and lowered position $z_1$*, and the unit target lifted and lowered position $z_2$*, the component assembly work is performed by the suction nozzle 28.

[D] Positional deviation Data Obtaining Method

The positional deviation data can be obtained according to a positional deviation data obtaining method of Example. Specifically, obtaining is possible (A) by operating the suction nozzle 28 while setting and changing the nozzle lifted and lowered position $z_1$ at a plurality of positions, and setting and changing the unit lifted and lowered position $z_2$ at a plurality of positions (device operating step), and (B) by approving the positional deviation (Δx, Δy) which is associated with both each of the plurality of nozzle lifted and lowered positions $z_1$ and each of the plurality of unit lifted and lowered positions $z_2$ based on a result of operating the suction nozzle 28 at this time (positional deviation approving step). In other words, in a state where various combinations between the nozzle lifted and lowered position $z_1$ and the unit lifted and lowered position $z_2$ are realized as illustrated in the table in FIG. 3, the positional deviation (Δx, Δy) in the perpendicular direction of the suction nozzle 28 is approved, and the positional deviation data is created based on the approved positional deviation (Δx, Δy). Specifically, for example, the positional deviation data can be obtained by the following two methods that are respectively Examples.

i) First Method

Figure 5B:
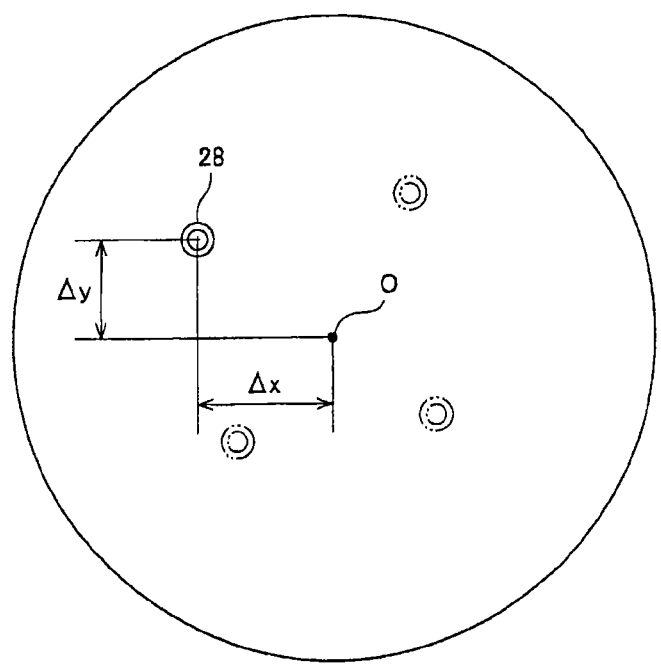

A first method of Example is a method for operating the suction nozzle 28 above the camera 38 illustrated in FIG. 1, imaging the suction nozzle 28, and obtaining the positional deviation (Δx, Δy) based on image data obtained by imaging. Specifically, as illustrated in FIG. 5(a), above the camera 38, in a state where the above-described plurality of combinations between the nozzle lifted and lowered position $z_1$ and the unit lifted and lowered position $z_2$ are realized, a tip end of the suction nozzle 28 is imaged. An image which is obtained by imaging is illustrated in FIG. 5(b), and displacement of the tip end of the suction nozzle 28 from a reference point O when it is assumed that there is no positional deviation is approved as the positional deviation (Δx, Δy).

Meanwhile, in order to exclude an influence of a curve or the like of the suction nozzle 28, in each combination between the nozzle lifted and lowered position $z_1$ and the unit lifted and lowered position $z_2$, the suction nozzle 28 is positioned at various rotating positions (for example, four rotating positions which are different in phase by 90° from each other) by the nozzle rotating device 32, and based on the plurality of positional deviations (Δx, Δy) which are approved by imaging at each rotating position, for example, by averaging these positional deviations, the positional deviation may be approved in each combination.

In addition, it is desirable that the nozzle lifted and lowered position $z_1$ and the unit lifted and lowered position $z_2$ change in a range where the tip end of the suction nozzle 28 is within a depth of field of the camera 38. In addition, one combination between the nozzle lifted and lowered position $z_1$ and the unit lifted and lowered position $z_2$ which is positioned at a height of the center of the depth of field of the tip end of the suction nozzle 28, may be a combination between the standard nozzle lifted and lowered position $z_{10}$ and the standard unit lifted and lowered position $z_{20}$.

ii) Second Method

Another method of Example is a method for setting a reference jig in the base material conveyer device 14 instead of the base material S, operating the suction nozzle 28, actually assembling the component P on the jig by the suction nozzle 28, detecting the positional deviation of the component which is assembled as a result of the operation by an inspecting machine or the like, and approving the positional deviation (Δx, Δy) of the suction nozzle 28 in the perpendicular direction based on the detected positional deviation.

For example, as illustrated in FIG. 6, a reference jig 60 includes a printed circuit board 62, and a bed plate 64 which is installed on the printed circuit board. Since the component P is assembled to an upper surface of the bed plate 64, in order to realize various combinations between the nozzle lifted and lowered position $z_1$ and the unit lifted and lowered position $z_2$, by using a plurality of reference jigs 60 in which the bed plates 64 having different heights h from each other are installed, the component P is assembled. When detecting the positional deviation of the assembly position of the component P, a position fiducial mark 66 which is affixed to the upper surface at a corner of the printed circuit board 62 is referred as a detection reference. It is desirable that the position fiducial mark is also affixed to the actual base material S, and is affixed at a position which has the same height as that of the position fiducial mark affixed to the base material S.

In the second method, the head moving position (x, y) can be changed, and the component P can be assembled across the entire surface of the bed plate 64. Therefore, the second method is appropriate for obtaining the plurality of positional deviation data which is also associated with the above-described head moving position (x, y).

In addition, similarly to the first method, in order to exclude the curve or the like of the suction nozzle 28, in each combination between the nozzle lifted and lowered position $z_1$ and the unit lifted and lowered position $z_2$, it is desirable that the suction nozzle 28 is rotated at various rotating positions by the nozzle rotating device 32, and the component P is assembled at each of various rotating positions. In this case, based on the positional deviation of the assembly position of the component P at each rotating position, for example, by averaging these positional deviations, the positional deviation may be approved in each combination.

In addition, when the component P is assembled to the reference jig 60, since the position and the posture of holding the component P by the suction nozzle 28 vary, it is desirable that the components P of which the number is great to a certain extent are assembled in one combination between the nozzle lifted and lowered position $z_1$ and the unit lifted and lowered position $z_2$, and based on the many detected positional deviations, a value which is obtained by using a statistical method with respect to the detected positional deviations is approved as the positional deviation.

[E] Modification Example

The component assembly machine 10 of the above-described Example includes the suction nozzle 28 as the component holding device in the working head 24. However, by exchanging the working device or the working head, for example, the component assembly machine 10 can function as a general-purpose work machine provided with various types of working heads which can include a clamp-type component holding device, an application device for performing coating of an adhesive or the like, a processing device which performs laser processing or the like, or a processing device which performs improving a quality of a front surface.

In addition, in the component assembly machine 10 of the above-described Example, the positional deviation data in a form of a table is stored in the positional deviation data memory section 50 of the control device 40. However, instead of the positional deviation data, for example, a function which uses each of the nozzle lifted and lowered position $z_1$ and the unit lifted and lowered position $z_2$ as a parameter may be stored as the positional deviation data.

In the positional deviation data obtaining method of the above-described Example, by using the actual suction nozzle 28, the positional deviation data is obtained. However, instead of the actual suction nozzle 28, the positional deviation data may be obtained, for example, by using a dedicated reference nozzle (jig nozzle) in which the above-described curve or the like is managed. In addition, in a case of the above-described first method, the positional deviation data may be obtained by using the reference jig which does not have a function of sucking and holding the component P.

In addition, the second method of the above-described Example may be employed, not only in the working head which is provided with a plurality of lifting and lowering devices similarly to the nozzle lifting and lowering device 24 and the unit lifting and lowering device 36, but also in the working head which is provided only with one lifting and lowering device (for example, the nozzle lifting and lowering device 24) in a case where the assembly accuracy which is necessary in the work machine cannot be realized if the lifting and lowering range of the lifting and lowering device is wide (for example, equal to or greater than 20 cm, and preferably equal to or greater than 15 cm) and the positional deviation is not corrected within the lifting and lowering range. For example, the second method may be employed in a work machine having a similar structure as the component assembly machine 10 of Example of the present invention, except that the unit lifting and lowering device 36 is not provided. In other words, the second method may be employed in a work machine which includes: a working head that includes a lifting and lowering unit including a working device and a first lifting and lowering device that lifts and lowers the working device along a first lifting and lowering axis line that extends in the vertical direction; a head moving device which moves the working head in the perpendicular direction which is perpendicular to the vertical direction; and a control device which controls the first lifting and lowering device and the head moving device. In such a work machine, the control device stores the positional deviation data in accordance with the nozzle lifted and lowered position $z_1$, and the head target moving position (x*, y*) may be corrected based on the nozzle target lifted and lowered position $z_1$* with reference to the positional deviation data. In addition, in order to obtain the positional deviation data, the positional deviation data may be obtained for every nozzle lifted and lowered position $z_1$ which corresponds to the height of each assembly surface of the base material S.

REFERENCE SIGNS LIST

10: Component assembly machine [work machine], 22: Head moving device, 24: Working head, 28: Suction nozzle [component holding device, working device], 30: Nozzle lifting and lowering device [first lifting and lowering device], 32: Nozzle rotating device [device rotating device], 34: Lifting and lowering unit, 36: Unit lifting and lowering device [second lifting and lowering device], 38: Camera [imaging device], 40: Control device, 50: Positional deviation data memory section, 52: Target position determining section, 54: Head target moving position correcting section, 56: Work performing section, $L_1$: First lifting and lowering shaft line, $L_2$: Second lifting and lowering shaft line, $L_M$: Reference shaft line of component assembly machine, ($\Delta x$, $\Delta y$): Positional deviation, $z_1$: Nozzle lifted and lowered position, $z_2$: Unit lifted and lowered position, (x, y): Head moving position, $z_1$*: Nozzle target lifted and lowered position, [first target lifted and lowered position], $z_2$*: Unit target lifted and lowered position [second target lifted and lowered position], (x*, y*): Target head moving position, ($x_C$*, $y_C$*): Head target moving position after correction

The invention claimed is:

1. A work machine, comprising:
a working head which includes (a) a lifting and lowering unit including a working device and a first lifting and lowering device which lifts and lowers the working device along a first lifting and lowering axis line that extends in a vertical direction, and (b) a second lifting and lowering device which lifts and lowers the lifting and lowering unit along a second lifting and lowering axis line that extends in the vertical direction; a head moving device which moves the working head in a perpendicular direction which is perpendicular to the vertical direction; and
a control device which controls the first lifting and lowering device, the second lifting and lowering device, and the head moving device,
wherein the control device includes:
a target position determining section which determines each of a first target lifted and lowered position which is a target of a lifted and lowered position of the working device, a second target lifted and lowered position which is a target of a lifted and lowered position of the lifting and lowering unit, and a head target moving position which is a target of a moving position of the working head in the perpendicular direction, when work is performed by the working device,
a positional deviation data memory section which stores positional deviation data in which the positional deviation of the working device in the perpendicular direction at least due to an inclination of the first lifting and lowering axis line and an inclination of the second lifting and lowering axis line is associated with both the lifted and lowered position of the working device and the lifted and lowered position of the lifting and lowering unit, a head target moving position correcting section which corrects the determined head target moving position based on the determined first target lifted and lowered position and the second target lifted and lowered position with reference to the stored positional deviation data, and a work performing section which performs work by the working device by controlling the first lifting and lowering device, the second lifting and lowering device, and the head moving device based on the determined first target lifted and lowered position, the determined second target lifted and lowered position, and the corrected head target moving position.

2. The work machine according to claim 1, wherein the positional deviation data is associated with both the lifted and lowered position of the working device and the lifted and lowered position of the lifting and lowering unit which are respectively discretely set, and wherein the head target moving position correcting section performs interpolation processing based on the positional deviation which is associated with the lifted and lowered position of the working device and the lifted and lowered position of the lifting and lowering unit that are set in the positional deviation data, and corrects the determined head target moving position based on the positional deviation obtained by the interpolation processing, when at least one of the determined first target lifted and lowered position and the determined second target lifted and lowered position is the lifted and lowered position of the working device or the lifted and lowered position of the lifting and lowering unit which are not set in the positional deviation data.

3. The work machine according to claim 1, wherein the positional deviation data is data in which the positional deviation of the working device in the perpendicular direction is also associated with the moving position of the working head in the perpendicular direction.

4. A positional deviation data obtaining method which is a method for obtaining positional deviation data which is stored in the positional deviation data memory section of the work machine according to claim 1, the method comprising:

a device operating step of operating the working device by changing the lifted and lowered position of the working device between a plurality of set positions, and by changing the lifted and lowered position of the lifting and lowering unit between a plurality of set positions; and a positional deviation approving step of approving the positional deviation of the working device in the perpendicular direction which is associated with both each of the plurality of lifted and lowered positions of the working device and each of the plurality of lifted and lowered positions of the lifting and lowering unit, based on a result of operating the working device in the device operating step.

5. The positional deviation data obtaining method according to claim 4, wherein the lifting and lowering unit includes a device rotating device which rotates the working device around an axis line in parallel to a vertical direction, wherein the device operating step is a step which is also performed to change the rotating position of the working device, and wherein the positional deviation approving step is a step of approving the positional deviation of the working device in the perpendicular direction which is associated with both each of the plurality of lifted and lowered positions of the working device and each of the plurality of lifted and lowered positions of the lifting and lowering unit, based on the positional deviation of the working device in the perpendicular direction in each of the plurality of rotating positions of the working device.

6. The positional deviation data obtaining method according to claim 4, wherein the work machine is provided with an imaging device which images the working device from above or from below, wherein the device operating step includes a step of imaging the working device by the imaging device at each of the plurality of lifted and lowered positions of the working device which are different from each other and at each of the plurality of lifted and lowered positions of the lifting and lowering unit which are different from each other while the device operating step is performed below or above the imaging device, and wherein the positional deviation approving step includes a step of approving the positional deviation of the working device in the perpendicular direction, which is associated with both each of the plurality of lifted and lowered positions of the working device and each of the plurality of lifted and lowered positions of the lifting and lowering unit, based on imaged data of the working device which is imaged by the imaging device as a result of operating the working device.

7. The positional deviation data obtaining method according to claim 4, wherein the working device is a component holding device which holds a component, and the work machine is a component assembly machine which assembles the component which is held by the component holding device to a base material, wherein the device operating step includes a step of assembling the component at positions which are different from each other in the vertical direction, and wherein the positional deviation approving step includes a step of approving the positional deviation of the working device in the perpendicular direction which is associated with both each of the plurality of lifted and lowered positions of the working device and each of the plurality of lifted and lowered positions of the lifting and lowering unit, based on the positional deviation of the assembled component in the perpendicular direction as a result of operating the working device.

* * * * *